(12) United States Patent
Roberts et al.

(10) Patent No.: US 9,525,413 B2
(45) Date of Patent: Dec. 20, 2016

(54) POWER SWITCHING SYSTEMS COMPRISING HIGH POWER E-MODE GAN TRANSISTORS AND DRIVER CIRCUITRY

(71) Applicant: GaN Systems Inc., Ottawa (CA)

(72) Inventors: John Roberts, Kanata (CA); Iain H. Scott, Ottawa (CA)

(73) Assignee: GaN Systems Inc., Ottawa (CA)

( * ) Notice: Subject to any disclaimer, the term of this patent is extended or adjusted under 35 U.S.C. 154(b) by 0 days.

(21) Appl. No.: 15/099,459

(22) Filed: Apr. 14, 2016

(65) Prior Publication Data

US 2016/0233859 A1 Aug. 11, 2016

Related U.S. Application Data

(63) Continuation-in-part of application No. PCT/CA2015/000168, filed on Mar. 10, 2015.
(Continued)

(51) Int. Cl.
*H03K 3/00* (2006.01)
*H03K 17/687* (2006.01)
(Continued)

(52) U.S. Cl.
CPC ......... *H03K 17/687* (2013.01); *H01L 29/2003* (2013.01); *H01L 29/7787* (2013.01); *H03K 5/08* (2013.01)

(58) Field of Classification Search
USPC .......... 327/108–109, 112, 419, 427
See application file for complete search history.

(56) References Cited

U.S. PATENT DOCUMENTS 8,054,110 B2   11/2011   Wang et al.
8,531,233 B2 *  9/2013   Tasaka ............... H03K 17/74
                                                    327/108
(Continued)

FOREIGN PATENT DOCUMENTS

WO    2014094115 A1    6/2014
WO    2015061881 A1    5/2015
(Continued)

OTHER PUBLICATIONS

International Search Report issued on International Application No. PCT/CA2015/000168 mailed Jun. 18, 2015; 3 pages.
(Continued)

*Primary Examiner* — An Luu
(74) *Attorney, Agent, or Firm* — Miltons IP/p.i.

(57) ABSTRACT

Driver circuitry for switching systems comprising enhancement mode (E-Mode) GaN power transistors with low threshold voltage is disclosed. An E-Mode high electron mobility transistor (HEMT) D3 has a monolithically integrated GaN driver, comprising smaller E-Mode GaN HEMTs D1 and D2, and a discrete dual-voltage pre-driver. In operation, D1 provides the gate drive voltage to the gate of the GaN switch D3, and D2 clamps the gate of the GaN switch D3 to the source, via an internal source-sense connection closely coupling the source of D3 and the source of D2. An additional source-sense connection is provided for the pre-driver. Boosting the drive voltage to the gate of D1 produces firm and rapid pull-up of D1 and D3 for improved switching performance at higher switching speeds. High current handling components of the driver circuitry are integrated with the GaN switch and closely coupled to reduce inductance, while the discrete pre-driver can be thermally separated from the GaN chip.

16 Claims, 11 Drawing Sheets

Related U.S. Application Data

(60) Provisional application No. 61/951,679, filed on Mar. 12, 2014.

(51) Int. Cl.
*H01L 29/778* (2006.01)
*H01L 29/20* (2006.01)
*H03K 5/08* (2006.01)

(56) References Cited

U.S. PATENT DOCUMENTS

| | | | |
|---|---|---|---|
| 8,593,211 | B2 | 11/2013 | Forghani-Zadeh et al. |
| 8,766,711 | B2 | 7/2014 | Takemae |
| 8,947,154 | B1 * | 2/2015 | Shah .................. H03K 17/687 327/427 |
| 9,105,560 | B2 | 8/2015 | Roberts et al. |
| 2013/0187713 | A1 | 7/2013 | Acar et al. |
| 2013/0241621 | A1 | 9/2013 | Forghani-Zadeh et al. |
| 2014/0070786 | A1 | 3/2014 | Guerra et al. |
| 2014/0092508 | A1 | 4/2014 | Ko et al. |
| 2014/0175454 | A1 | 6/2014 | Roberts et al. |
| 2015/0097613 | A1 | 4/2015 | Roewe et al. |
| 2015/0318851 | A1 | 11/2015 | Roberts et al. |

FOREIGN PATENT DOCUMENTS

| | | |
|---|---|---|
| WO | 2015135072 A1 | 9/2015 |
| WO | 2015157845 A1 | 10/2015 |

OTHER PUBLICATIONS

Boutros, K. S. et al.; "GaN Power Electronics for Automotive Applications"; IEEE; 2012; Energytech; http://toc.proceedings.com/15872webtoc.pdf; pp. 1-4.

Roberts, John; "Lateral GaN Transistors—A Replacement for IGBT devices in Automotive Applications"; PCIM Europe 2014; International Exhibition and Conference for Power Electronics, Intelligent Motion, Renewable Energy and Energy Management; May 20-22, 2014; pp. 310-317.

Lidow, A.; "The GaN Journey Begins", IEEE SCV Electron Devices Society (EDS), Oct. 12, 2010; pp. 1-28.

Texas Instruments Inc.; Datasheet; LM5113 5A, 100V Half-Bridge Gate Driver for Enhancement Mode GaN FETs; SNVS725F—Jun. 2011—Revised Apr. 2013; pp. 1-21.

GaN Systems Inc.; Application Note: "How to Drive GaN Enhancement Mode Power Switching Transistors"; GN001, Rev. Oct. 21, 2014; pp. 1-13.

Strydom, J. & Lidow, A.; "Driving eGaN Transistors for Maximum Performance"; Darnell Power Forum; Sep. 2010; pp. 1-8.

Lidow, A. & Strydom, J.; "The eGaN FET Journey Begins"; IBM Power Symposium; May 2011.

Strydom, J.; "Driving eGaN (TM) FETs"; Bodo's Power Systems; Nov. 2010; www.bodospower.com; pp. 50-52.

Strydom, J.; "The eGaN (TM) FET-Silicon Power Shoot-out: 2: Drivers, Layout"; Power Electronics Technology; Jan. 2011; www.powerelectronics.com; pp. 14-19.

Roberts et al.; "Integrated Gate Drivers for e-Mode Very High Power GaN Transistors"; IEEE; 2015; pp. 16-19.

* cited by examiner

POWER SWITCHING SYSTEMS COMPRISING HIGH POWER E-MODE GAN TRANSISTORS AND DRIVER CIRCUITRY

CROSS-REFERENCE TO RELATED APPLICATIONS

This application is a continuation-in-part of PCT International patent application No. PCT/CA2015/000168, filed Mar. 10, 2015, designating the United States, which claims priority from U.S. Provisional Patent Application No. 61/951,679, entitled "Power Switching Systems comprising High Power E-Mode GaN Transistors And Driver Circuitry", filed Mar. 12, 2014, each of which is incorporated herein by reference in its entirety.

TECHNICAL FIELD

This invention relates to high voltage GaN transistors, such as GaN power switches for automotive and other applications; it relates particularly to high-power, normally-off or enhancement-mode (E-Mode) GaN transistors, such as GaN High Electron Mobility Transistors (GaN HEMTs).

BACKGROUND

High power devices for automotive applications are required to operate at high temperatures and provide for high current operation. The current power train requirements of most hybrid vehicles (HV) and electric vehicles (EV) are met using silicon IGBT (Insulated Gate Bipolar Transistor) devices. Higher performance can be achieved with GaN power transistors based on advantages, such as, lower on-resistance, higher operating temperatures, and smaller systems. However improvements offered by GaN devices are yet to be realized in deployed subsystems.

Several groups of researchers are experimenting and reporting on GaN transistors that are aimed at replacing Si IGBTs. Advantages of GaN devices are summarized in an article by Boutros, Chu and Hughes, entitled "GaN Power Electronics for Automotive Applications", (IEEE 2012 Energytech—http://toc.proceedings.com/15872webt-oc.pdf). As an example, electric propulsion units require high-current (200 to 600 A), high-voltage (100 to 600V), low loss power semiconductor switches. GaN switches are expected to offer ~100× performance over silicon-based devices, owing to superior material properties such as high electron mobility and high breakdown field and capability to provide GaN power electronics with low on-resistance and fast switching, and higher operating temperatures (Roberts, "Lateral GaN Transistors—A Replacement for IGBTs in Automotive Applications", PCIM Europe 2014; International Exhibition and Conference for Power Electronics, Intelligent Motion, Renewable Energy and Energy Management; Proceedings of; 20-22 May 2014).

At present, very few high-voltage GaN devices for automotive applications are available on the open marketplace. However, as these devices reach maturity, it is expected that GaN power switches will be introduced into the automotive market for a number of applications such as power generators, power conversion units and electronically controlled on-demand accessories.

For safe operation, normally-off GaN devices with high current and voltage capability are required. Normally-off operation may be provided by series connecting a normally-on GaN transistor with a driver MOSFET in cascode configuration. Alternatively, an enhancement mode (E-Mode) normally-on GaN transistor may be used.

A cascode structure can use a conventional MOSFET or a custom structured MOSFET to provide a threshold voltage that approximates to or has an advantage over an IGBT device, e.g. ~3V and ~5V for Silicon SJ MOSFETS and Silicon IGBT devices respectively. Alternatively, a normally-off E-Mode GaN transistor can be used. However, E-Mode GaN devices generally have very low threshold voltages, typically 1.5V or less. This poses a significant problem for safe operation, particularly with respect to noise issues and parasitic elements which could cause voltage spikes or noise in excess of the threshold voltage, thus unintentionally turning on the device. Clearly this is a safety hazard for high current and high voltage applications, such as, automotive applications. While it would be desirable to have threshold voltages of 3V or more for high power applications, currently, few vendors offer E-Mode devices with threshold voltages above 2V, and devices with threshold voltages above 3V are rare. Thus, to manage transients caused by noise issues and parasitic elements and ensure safe operation, low threshold voltage E-Mode GaN transistors require carefully designed driver circuitry with signal isolators, isolated +VE and −VE power supplies and a source-sense Kelvin connection.

In addition to considering the potential for noise to cause false switching, another issue for safe operation is the Miller capacitance effect. The latter could result in the power transistor being turned back on when the gate is being taken low.

Drivers for cascode GaN devices are disclosed in co-pending PCT International patent application No. PCT/CA2013/001019, entitled "Devices and Systems Comprising Drivers for Power Conversion Circuits", filed 13 Dec. 2013, claiming priority from U.S. provisional patent application No. 61/740,825 filed 21 Dec. 2012, of the same title, and U.S. patent application Ser. No. 14/105,569, entitled "Devices and Systems for Power Conversion Circuits", filed 13 Dec. 2013, claiming priority from U.S. provisional patent application No. 61/740,821, filed 21 Dec. 2012, of the same title. The use of discrete components and separate driver circuits necessitates interconnection of the components by wire-bonding or other interconnect technologies, which introduces unwanted inductance. Co-packaging of a GaN power device and MOSFET driver circuit also requires effective thermal management. These patent applications disclose driver circuits and packaging arrangements for a cascode configuration GaN device, which seek to address one or more issues of thermal management, series inductance and resistance, to reduce or manage unwanted noise and voltage transients, and enable lower cost and more compact systems and devices for electronic power conversion circuits.

However, for E-Mode GaN devices with lower threshold voltages, the use of discrete driver circuitry poses even more significant challenges in managing these issues with noise and parasitic elements, including Miller capacitance effects. Accordingly, there is a need for improved solutions using integrated drivers for E-Mode GaN devices.

The Miller Ratio (QGD/QGS) provides an indication of how sensitive a switching transistor is to false, unwanted switching. As the rated voltage increases the GaN transistor Miller Ratio degrades. Thus, higher voltage GaN transistors are more susceptible to false, unwanted transient operation than low voltage GaN transistors.

The need to overcome these driver difficulties was recognized some years ago, at the time small low voltage GaN transistors were first introduced, for example, as disclosed in a presentation by A. Lidow entitled "The GaN Journey Begins", IEEE SCV Electron Devices Society (EDS), Oct. 12, 2010.

The following references, and other references cited therein, provide further background information on drivers for GaN FETS:

a) Texas Instruments Inc. Datasheet LM5113 5A, 100V Half-Bridge Gate Driver for Enhancement Mode GaN FETs (SNVS725F—JUNE 2011—REVISED APRIL 2013);

b) U.S. Pat. No. 8,593,211 to Forghani-Sadeh (Texas Instruments Inc.) entitled "System and apparatus for driver circuit for protection of gates of GaN FETS; and c) U.S. Pat. No. 8,766,711 to Takemae (Transphorm Japan Inc.) discloses integrated drive circuitry.

There is a need for further improvements in driver circuitry for E-Mode GaN devices, particularly for power switching systems comprising high power e-mode GaN transistors with integrated driver circuitry.

SUMMARY OF INVENTION

Aspects of the invention provide systems comprising high power E-Mode GaN switches and driver circuitry and methods for operation thereof.

Thus, one aspect of the invention provides a GaN switching device 110 comprising:

an enhancement mode (E-Mode) GaN switch 120 having an integrated GaN driver 130; the E-Mode GaN switch 120 comprising a GaN transistor switch D3 fabricated on a substrate (GaN chip) 101 and the integrated GaN driver 130 integrated monolithically with the GaN transistor D3 on the GaN chip 101, wherein:

the integrated GaN driver 130 comprises first (highside or pull-up) E-Mode GaN driver transistor D1 and a second (lowside or pull-down) E-Mode GaN driver transistor D2, the drain of the D1 being coupled to Vcc, and the source of D1 being coupled to the drain of D2 at node N, which is coupled to the gate of D3, and an internal source-sense connection $SS_{internal}$ closely coupling the source of D3 and the source of D2, such that the first transistor D1 operates to delivers a drive voltage to the gate of the GaN transistor switch D3, and the second transistor D2 operates to clamp the gate of the GaN transistor switch D3 to the source of D3 by means of the internal source-sense connection $SS_{internal}$;

inputs for coupling to a pre-driver supplying gate drive voltages to the gates of D1 and D2 and optionally to the gate of D3, and an external source-sense connection $SS_{external}$ for coupling to the pre-driver.

Another aspect of the invention provides a GaN power switching system comprising:

an enhancement mode (E-Mode) GaN switch 120 and driver circuitry 112 comprising an integrated GaN driver 130 and a (separate/discrete) pre-driver 140, the E-Mode GaN switch 120 comprising a GaN transistor switch D3 fabricated on a first substrate (GaN chip) 101 and the integrated GaN driver 130 being integrated monolithically with the GaN transistor D3 on the GaN chip 101, wherein:

the integrated GaN driver 130 comprises a first (highside or pull-up) E-mode GaN driver transistor D1 and a second (lowside or pull-down) E-mode GaN driver transistor D2, the drain of D1 being coupled to the supply voltage Vcc, and the source of D1 being coupled to the drain of D2 at node N, which is coupled to the gate of D3, such that the first transistor D1 operates to deliver a drive voltage to the gate of the GaN transistor switch D3, and an internal source-sense connection closely coupling the source of D3 and the source of D2, such that the second transistor D2 operates to clamp the gate of the GaN transistor switch D3 by means of the internal source-sense connection $SS_{internal}$;

external gate connections (inputs) for supplying gate drive voltages from the pre-driver to each of the gates of D1 and D2, and optionally D3; and an external source-sense connection $SS_{external}$ for coupling to the pre-driver circuit; and the pre-driver 140 is fabricated on a second substrate (pre-driver chip/substrate) 102, the pre-driver having an input for receiving an input voltage Vin and outputs for delivering gate drive voltages to the gate connections of each of GaN driver transistors D1 and D2 of the integrated GaN driver.

In some embodiments the pre-driver further comprises an output for delivering a drive voltage to an external gate connection of D3.

D3 is, for example, a large E-Mode GaN HEMT having a gate width of >1000 mm, a threshold voltage of ~1.5V and D1 and D2 are relatively small gate width E-Mode GaN HEMTs. (Wg ~50 mm and 40 mm). The pre-driver circuit is configured so that the gate of D1 is always anti-phase to the gate of D2. Preferably, the pre-driver is a dual voltage pre-driver configured to provide a first drive voltage to the gate of D1 and a second drive voltage to the gate of D2, wherein the first drive voltage is higher than the second drive voltage. For example, the pre-driver supplies a first gate drive voltage $Vcc_1$ of 0-10V for D1 and the second gate drive voltage $Vcc_2$ of 0-6V for D2.

Another aspect of the invention provides a method of operating a GaN switch comprising:

providing a GaN switch comprising a E-Mode GaN HEMT D3 having monolithically integrated driver circuitry comprising first and second E-Mode GaN HEMTs D1 and D2, D1 being coupled to provide a gate drive voltage to the gate of D3 and D2 being coupled to clamp the gate of D3 to the source of D2 by means of an internal source-sense connection; and supplying from a discrete pre-driver a drive voltage to the gates of D1 and D2, and optionally to the gate of D3.

Preferably, the pre-driver is a dual voltage pre-driver and wherein for high speed switching, the method comprises: providing a higher drive voltage to the gate of D1.

Partitioning the driver circuitry into two sections, i.e. the integrated GaN driver and separate pre-driver, allows for monolithic integration of the components handling high current with the GaN transistor switch D3 on the GaN chip. This provides for reduced inductance of the coupling between the driver devices D1, D2 and the GaN transistor switch D3, while the discrete pre-driver which delivers the drive voltage to the integrated driver, is thermally separated from the GaN chip. This is beneficial because typically, GaN power transistors operate at temperatures higher than CMOS devices can comfortably cope with. Thus, when the pre-driver that is thermally separated from the GaN chip, the pre-driver can be a MOSFET device fabricated from low cost components.

The GaN power transistor switch D3 is preferably a large E-Mode GaN HEMT capable of handling 100 A or more, having a threshold voltage of ~1V or higher, which is operated with a gate drive supply voltage Vcc, e.g. 6V or more. Beneficially the discrete pre-driver and integrated driver provide for controlled and rapid pull-up of the gate of the GaN transistor switch. The driver circuitry is arranged so that the gate of D1 is always anti-phase to the gate of D2. Advantageously, for operation at higher switching speeds, e.g. at 20 kHz or higher, a supplementary power supply or dual voltage power supply is used to provide a higher drive voltage, e.g. $Vcc_1$ of 10V, to the gate of drive transistor D1 of the integrated driver circuit, to achieve rapid and firm pull up.

In an alternative embodiment, instead of a discrete pre-driver which requires a 10V supply, an arrangement is provided that uses a large discrete P-channel MOSFET to clearly pull the gate of D3 to the 6V supply. In a further embodiment, a more completely integrated solution uses a totally monolithic pre-driver that includes the large P-channel MOSFET, and thus provides an entirely integrated pre-driver function. Such an integrated pre-driver can be made using SOI (Silicon-on-Insulator) technology to achieve high temperature operation.

In yet another embodiment, the GaN switch comprises a GaN power switch D3 with integrated GaN driver comprising first and second GaN driver transistors D1 and D2. The pre-driver comprises voltage boost circuitry, e.g. a voltage doubler, which develops a 12V gate voltage drive ($Vcc_1$) for driver transistor D1 from a 6V supply voltage (Vcc or $Vcc_2$). The voltage boost circuit allows for simplification of the pre-driver circuitry, provides improved control of the drive voltage to D1, to achieve rapid pull-up of the gate of D3 to the supply voltage, while the pre-driver also provides effective anti-shoot through circuitry, i.e. to ensure D1 and D2 are not turned on at the same time.

Thus, systems are provided comprising semi-integrated or partitioned driver circuitry for high power E-Mode GaN switches that mitigate or circumvent one or more limitations of known devices and systems.

BRIEF DESCRIPTION OF THE DRAWINGS

In the drawings, identical or corresponding elements in the different Figures have the same reference numeral, or corresponding elements have reference numerals incremented by 100 in successive Figures.

The foregoing and other features, aspects and advantages of the present invention will become more apparent from the following detailed description, taken in conjunction with the accompanying drawings, of preferred embodiments of the invention, which description is by way of example only.

DETAILED DESCRIPTION OF EMBODIMENTS

Figure 1:
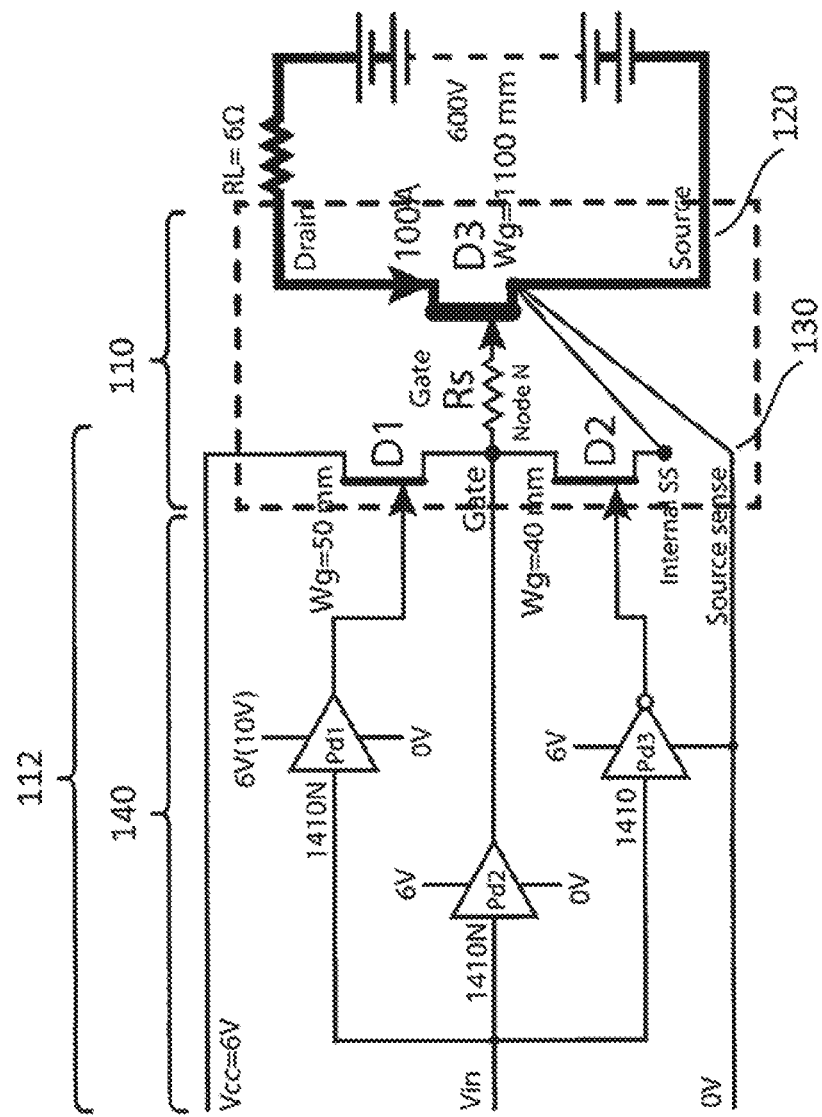
FIG. 1 shows a circuit schematic of a system comprising an E-Mode GaN HEMT and driver circuitry according to an embodiment of the invention.
Figure 2:
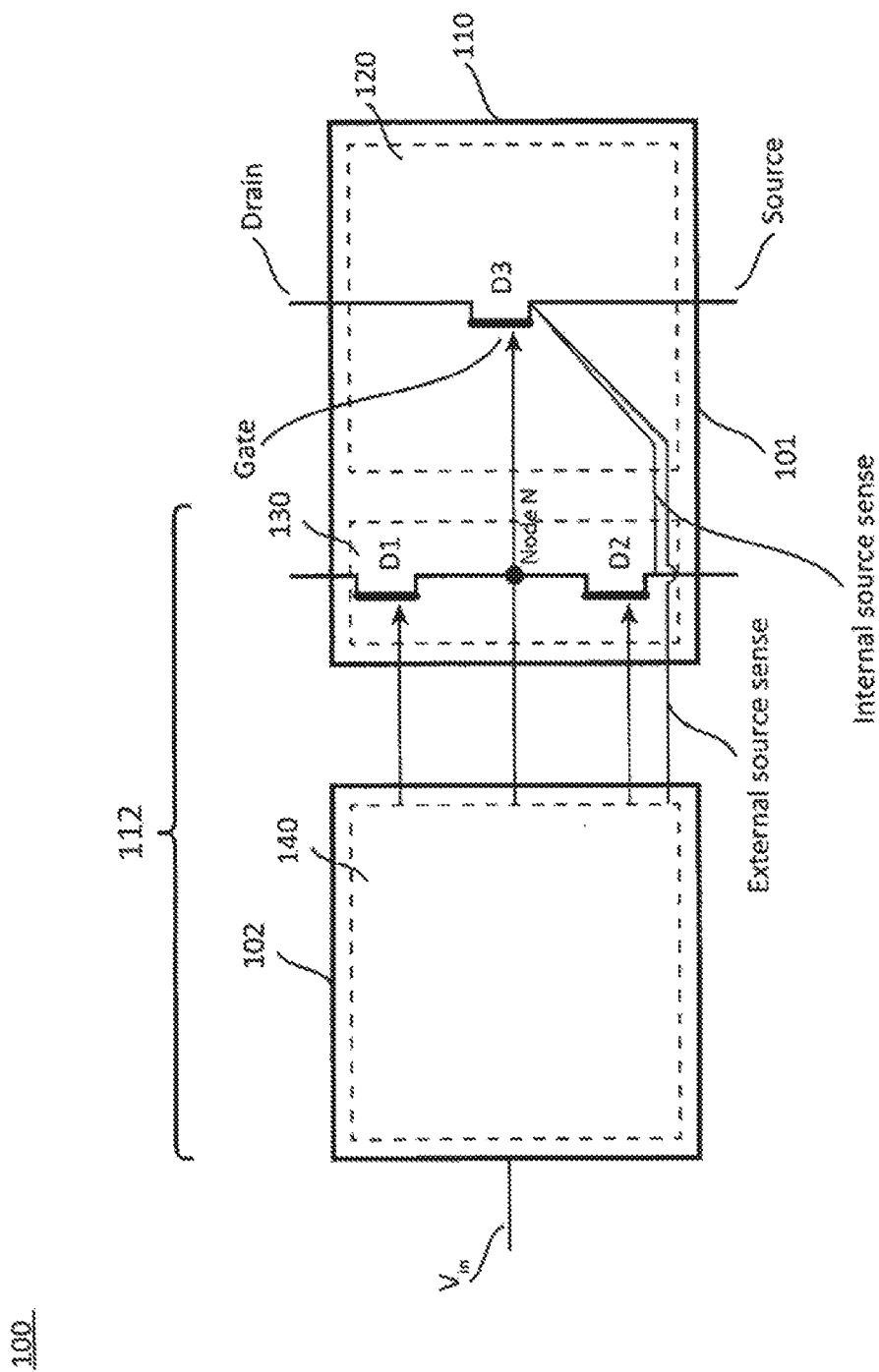
FIG. 2 shows a block diagram representing the system of FIG. 1.

A system 100 comprising a GaN switching device 110 and driver circuitry 112 according to an embodiment of the invention is shown in FIGS. 1 and 2. By way of example, in this embodiment, the GaN switching device or GaN chip 110 comprises an E-Mode GaN HEMT 120 (D3), which has a threshold voltage of ~1.5V, a gate width Wg of 1100 mm and is capable of switching 100 A and 600V.

The driver circuitry 112 is partitioned into two sections, as illustrated schematically in the block diagram shown in FIG. 2. Thus, the driver circuitry 112 comprises integrated GaN driver circuitry 130, which is monolithically integrated with the E-Mode GaN HEMT D3 on a first substrate 101, i.e. a GaN chip, and a discrete pre-driver circuit 140 on a second substrate 102. For example, the GaN chip comprises an epitaxial layer stack (epi-stack) comprising a layer of GaN and a layer of AlGaN forming GaN/AlGaN heterostructure providing an active region comprising a two-dimensional electron gas (2DEG), which is fabricated on a silicon carbide or silicon substrate.

Referring back to FIG. 1, the integrated GaN driver circuitry 130 comprises a first GaN transistor D1 and a second GaN transistor D2. These are relatively small E-Mode GaN HEMT, e.g. D1 has a gate width Wg of 50 mm and D2 has a Wg of 40 mm, and both are n-type. (Note this is in contrast to a conventional CMOS driver which comprises a p-type pull-up transistor and n-type pull-down transistor).

As illustrated, the drain of D1 is coupled to a 6V power supply Vcc, and the source of D1 is coupled to the drain of D2 at node N. Node N is coupled to the gate G of D3. In order to avoid the effect of di/dt voltages in the source inductance, and in view of the low threshold voltage of the normally-off GaN transistor D3, an internal source-sense (Kelvin) connection $SS_{internal}$ is provided between the source S of D3 and the source of D2. It is important that the $SS_{internal}$ connection be made as physically close as possible to the source S of D3, to provide direct and intimate coupling of the devices, as will be explained with reference to FIG. 12, so that the gate drive loop does not include (i.e. bypasses) the inherent on-chip source inductance $L_{S1}$ from on chip source connections, as well as the inherent off-chip source inductance $L_{S2}$, e.g. from interconnect or package inductance. Thus, when the first GaN transistor D1 is turned on, D1 provides the drive voltage for the gate G of the GaN power switch D3 and when the second GaN transistor D2 is turned on, D2 clamps the gate G of D3 to the source S of D2 using the internal source-sense Kelvin connection. An external source-sense connection $SS_{external}$ is also provided for closely coupling to the pre-driver circuit 140 to the source-sense signal.

The pre-driver circuitry 140 of the embodiment shown in FIG. 1 comprises three conventional CMOS buffer drivers, Pd1, Pd2 and Pd3. For example, as illustrated, these are Microchip TC1410N and TC1410 devices capable of providing up to 0.5 A of driver current. These devices respectively provide the non-inverting and inverting functions that are required for driving the relatively small GaN transistors D1 and D2 as described above.

The internal clamping of the gate of D3 to the source using the internal source-sense connection $SS_{internal}$ is a key to the integrated driver design. Thus, there are no package related parasitic inductive and resistive elements present within the clamp circuit. The clamping device D2 drives the power switch D3 off under control of the inverting driver Pd3, device type TC1410. Thus, D2 clamps the gate of D3 to the source of D3 to turn it off, despite the additional current being injected into the gate of D3 through the switching action of the drain of D3.

Figure 12:
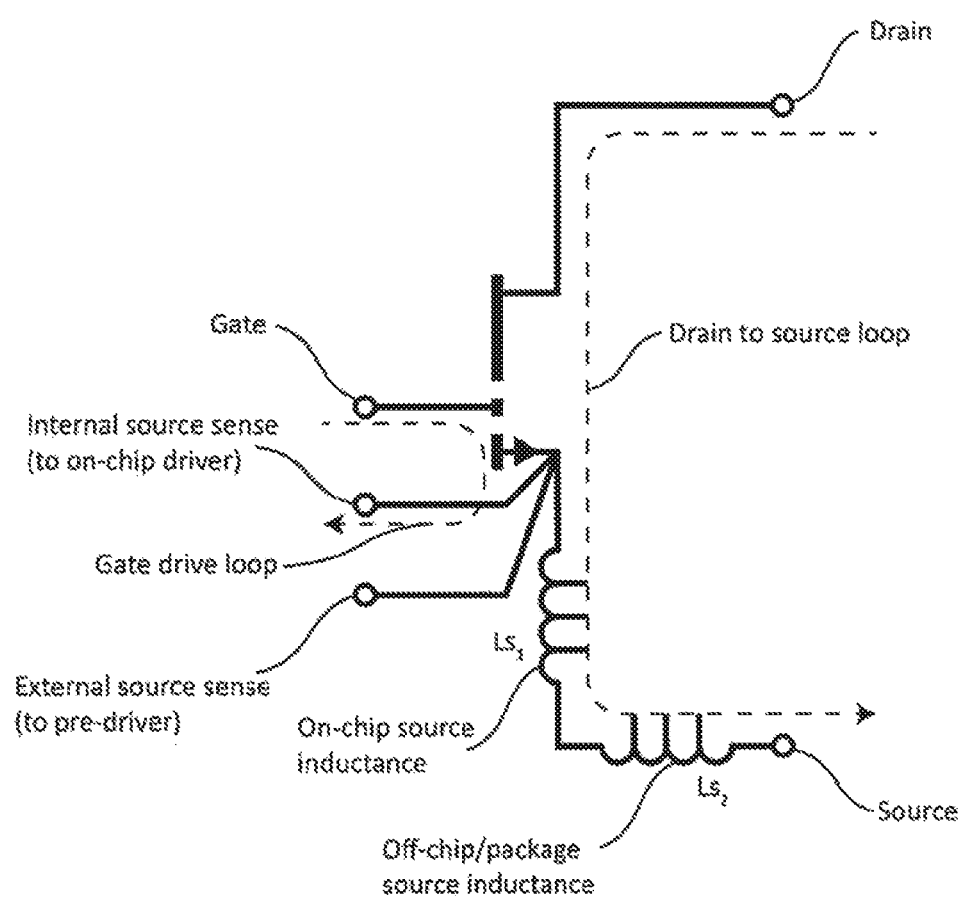
FIG. 12 shows a circuit schematic to illustrate the use of both internal and external source-sense connections for closely coupling the internal and external driver circuitry.

The advantages of providing both internal and external source sense connections $SS_{internal}$ and $SS_{external}$, to address on-chip and off-chip inductances, is further illustrated with reference to the circuit schematic of FIG. 12. The inductance in the connection to the source of the transistor is a critical issue because, for example, the amount of ringing on the gate due to a high slew rate is a function of the amount of source inductance present, both on-chip inductance and external inductance. As illustrated in FIG. 12, the source-sense connections separate the gate drive loop from the drain-source loop to minimize the adverse effect of parasitic inductances $L_{s1}$ and $L_{s2}$. Both the integrated on-chip driver and the discrete pre-driver are referenced to the source-sense signal, by the internal and external source sense connections, respectively. Thus, the gate driver circuit ground return, which may be either isolated or shared with control circuit, is referenced to the source sense signal using a star point connection.

Thus, the gate drive loop for the on-chip driver does not include, i.e. bypasses, the parasitic or inherent on-chip source inductance $L_{s1}$, because the internal source-sense connection $SS_{internal}$ provides close coupling of the source of D3 to the on-chip driver, i.e. directly and intimately coupling the source of D3 to the source of the on-chip driver transistor D2, as illustrated in FIGS. 1 and 2, for example, i.e. to minimize the gate drive loop. Similarly, the external source-sense connection to the pre-driver also does not include the inherent on-chip inductance $L_{s1}$ and inherent off-chip/interconnect inductance $L_{s2}$, e.g., from package wiring, in the drain source loop.

This GaN device or GaN chip comprising a high voltage/high current GaN E-mode transistor switch D3 with on-chip integrated E-mode GaN driver transistors D1 and D2 is referred to by the Applicant as a "Drive Assist' GaN E-mode transistor" switch and the driver transistors D1 and D2 are referred to as the upper and lower "drive assist" transistors. When driven by an appropriately designed external driver, D1 operates to provide the drive voltage for the gate G of the GaN power switch D3 and D2 operates to clamp the gate G of D3 to the source S of D2 via the internal source-sense Kelvin connection. Moreover, the integrated upper drive assist transistor D1 assists in providing noise immunity to the gate of D3, e.g. voltage spikes coming in on the gate of D3; and the integrated lower drive assist transistor D2, assists in preventing false turn-on due to the Miller effect during a switching transition of D3. Unexpectedly, it has been observed that the integrated lower drive assist transistor D2 also helps significantly to provide noise immunity to the gate of D3, i.e. by clamping the gate of D3 to the source to hold D3 off in the presence of noise voltage spikes coming in externally on the gate or source sense lines.

Figure 3:
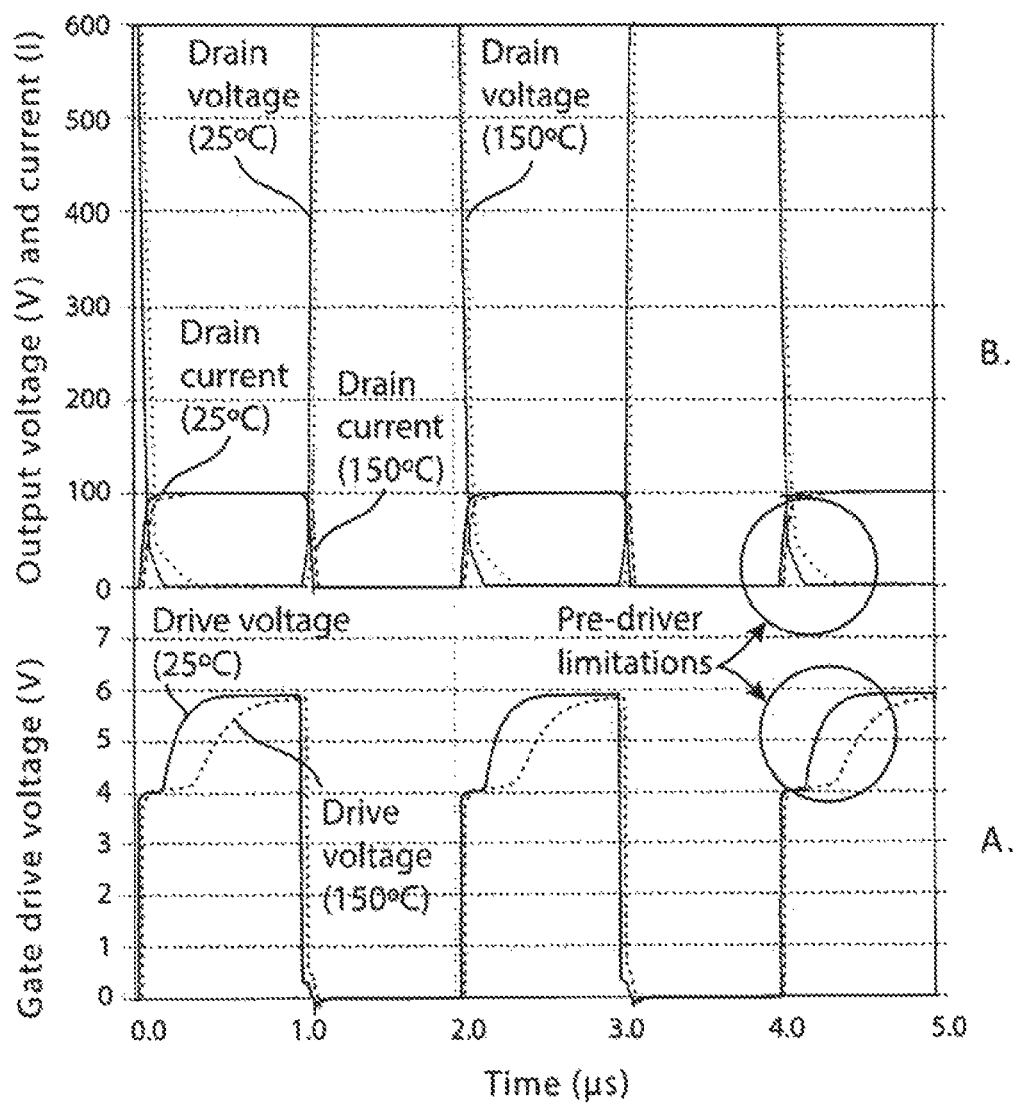
FIG. 3 shows A. a plot of the gate drive voltage vs. time and B. a plot of the output voltage and current vs. time using a 6V drive voltage on gate of the pull-up driver transistor D1.

The driver Pd1, device type TC1410N is non-inverting. Therefore, when the input voltage $V_{in}$ is high, the driver device D1 is on. The drive voltage provided to device D1 is critical to performance of the circuit. The "drive voltage" shown in simulation results of FIG. 3, charts A and B is the voltage applied to the gate of power switch D3. As shown in these charts, this "drive voltage" is critically dependent on either the performance of the pre-driver Pd2 and/or the driver transistor D1. Since the pre-driver has limited current capability, a poor transition between 4 and 6 volts is achieved as shown in FIG. 3, chart B.

Figure 4:
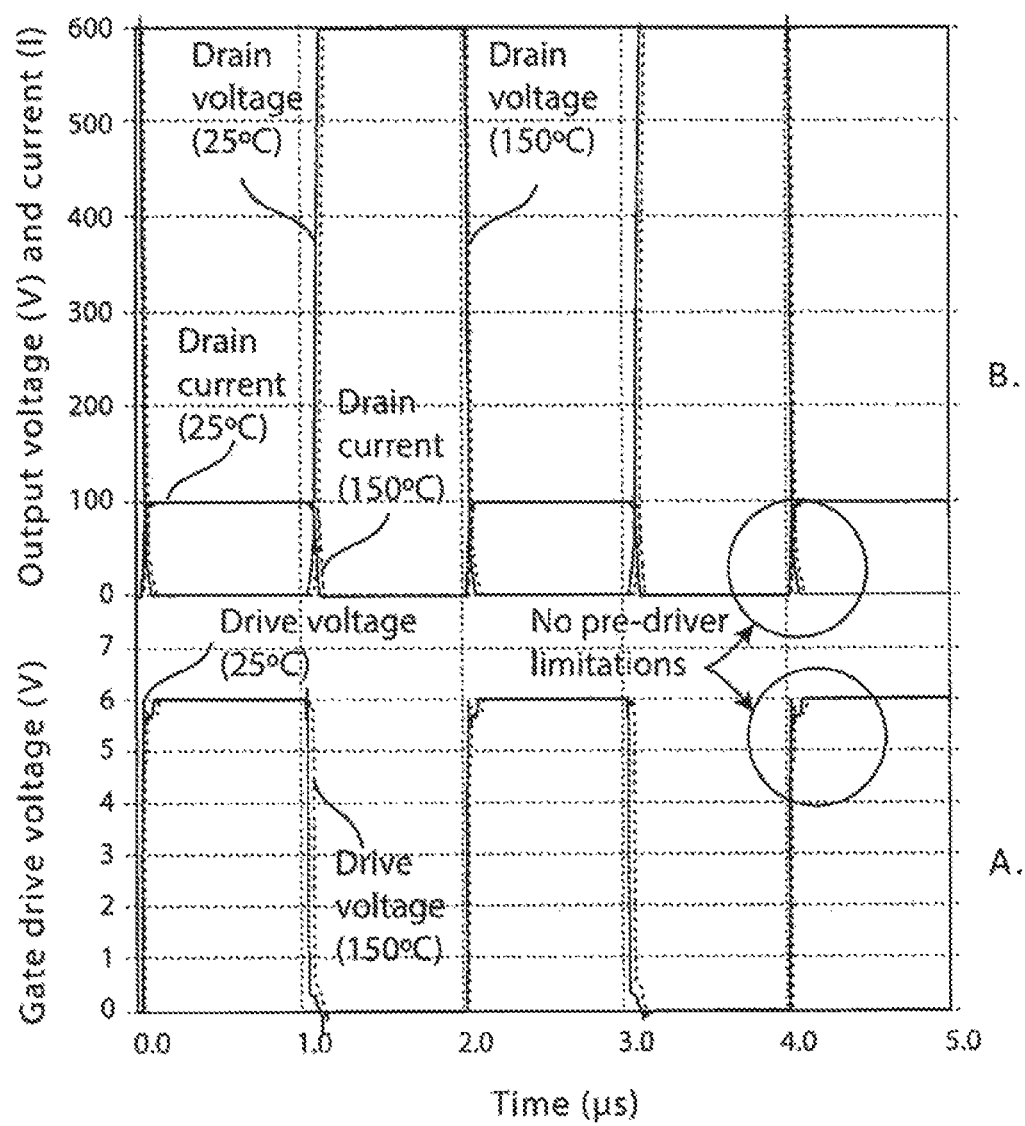
FIG. 4 shows A. a plot of the gate drive voltage vs. time and B. a plot of the output voltage and current vs. time using a 10V drive voltage on the gate of pull-up GaN driver transistor D1.

On the other hand, referring to FIG. 4, charts A and B, when the pre-driver Pd1 is provided with a higher voltage, i.e. from a 10V power supply, driver transistor D1 is firmly turned-on and clamps the gate G of the power switch D3 to the 6V power supply. As illustrated in FIG. 4, charts A and B, the use of the 10V power supply to more rapidly pull up the gate of D1 dramatically improved the switching characteristics of the system relative to operation with a 6V supply.

These simulations illustrate the effect of a power 0-6V drive voltage. Using the 10V power supply for Pd1 achieves the required drive voltage for device D1. The combination of the Miller effect and the non-linear increase of the gate capacitance at low voltage is the basis of the driver loading issues shown.

Figure 5:
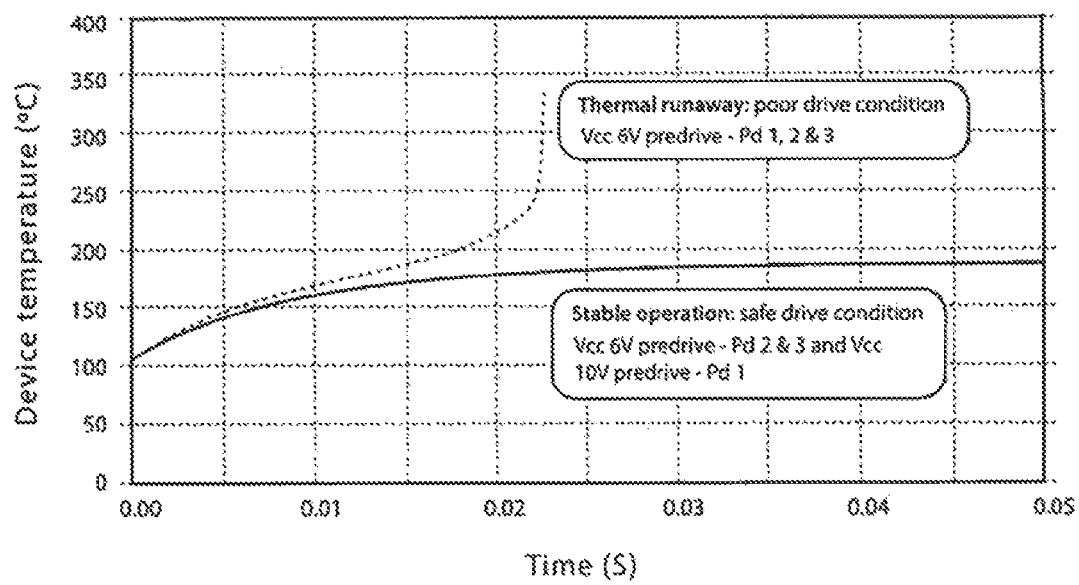
FIG. 5 shows a plot of device temperature vs. time for simulation results for operation with a 6V pre-driver and with a 10V pre-driver.

The survivability of the circuit is highly dependent on the quality of the drive voltage applied to the gate G of the power switch D3. SPICE simulations demonstrate that the switching losses caused by the finite rise and fall times of D3 totally dominate the switching power losses at lower frequency. Using a 20 kHz switching speed and circuits with and without an auxiliary 10V power supply for pre-driver Pd1, a temperature time chart can be plotted as shown in FIG. 5. The circuit with the poorer drive arrangement using a 6V gate drive voltage on D1 fails within 25 ms, having entered a thermal runaway condition. The successful dual voltage design using 10V gate drive voltage for D1 reaches a stable condition at 185° C. The simulation was based on the assumption that the device case temperature is held at 105° C.

These simulations show that the pull-up of the gate of driver transistor D1 must be handled very well for driving E-Mode HEMTs with low threshold voltages. Integration of some the driver circuitry on the GaN chip provides reduced inductance for improved control of the switching of device D. That is, the functionality of the driver circuitry is partitioned so that the driver components D1 and D2, which handle high current, are on the GaN chip and directly coupled to the GaN switch D3, thus reducing inductance. The two on-chip GaN driver transistors D1 and D2 supply most of the energy for switching, and produce fast switching with very narrow peaks of ~8 Amps from a 6V supply. These GaN drivers can easily handle operating temperatures of 175° C. However, since the GaN chip is hot, it is beneficial to have the discrete pre-driver CMOS circuitry thermally separated from the GaN chip. Thermal separation of the pre-driver circuitry from the hot GaN chip enables the use of small, inexpensive CMOS pre-drivers, for example, low cost Schmitt triggers with 3V or 4V thresholds and an input voltage $V_{in}$ of 3V or 5V. The latter are generally not suited for higher temperature operation.

Simulations indicate that a 6V supply for the pre-drivers would be adequate for switching speeds of below 20 kHz. However, provision of a 10V supply for Pd1 provides superior performance that is required at higher switching speeds, e.g. to avoid thermal runaway.

Figure 7:
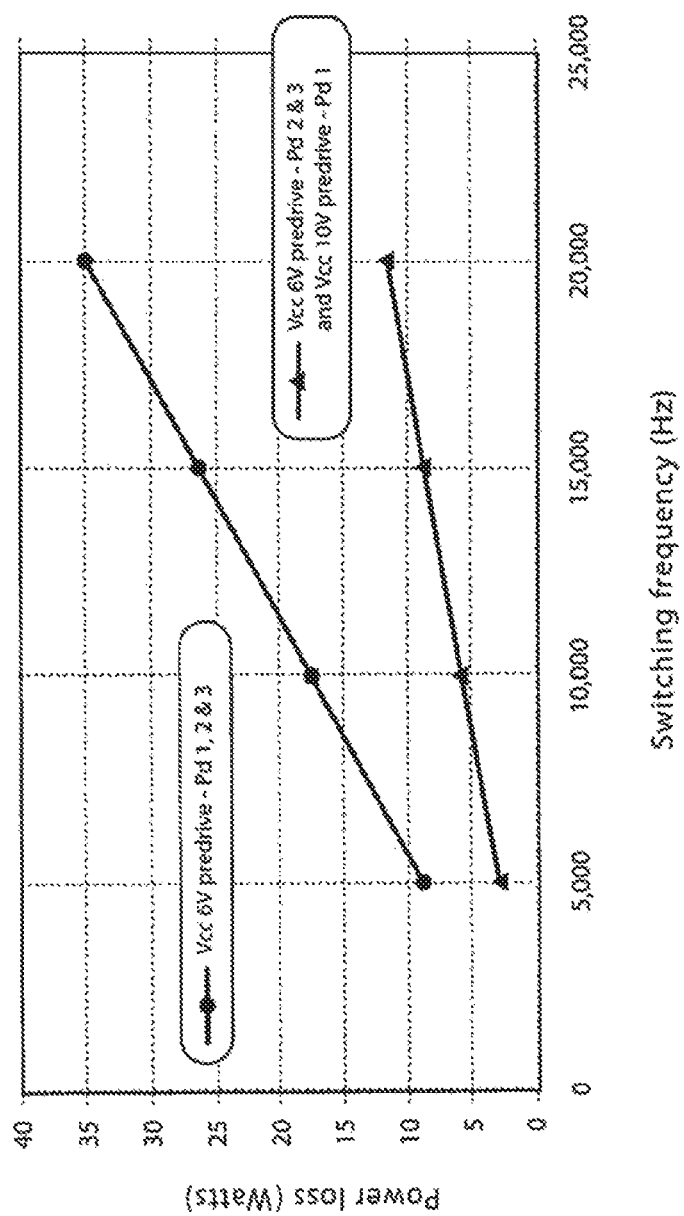
FIG. 7 shows a plot of the power loss vs. switching frequency.

One of the two main sources of power dissipation at the lower switching speeds is switching transition losses. FIG. 7 shows a plot of the power loss (Watts) vs. the switching frequency (Hz).

The other significant power losses are due to the finite on-resistance of the power switch. The cause of excessive switching transition power loss is the poor drive voltage as shown in the diagram of FIG. 3A. The correct sizing of the drive transistors D1 and D2 is important, as illustrated in FIG. 6.

Figure 6:
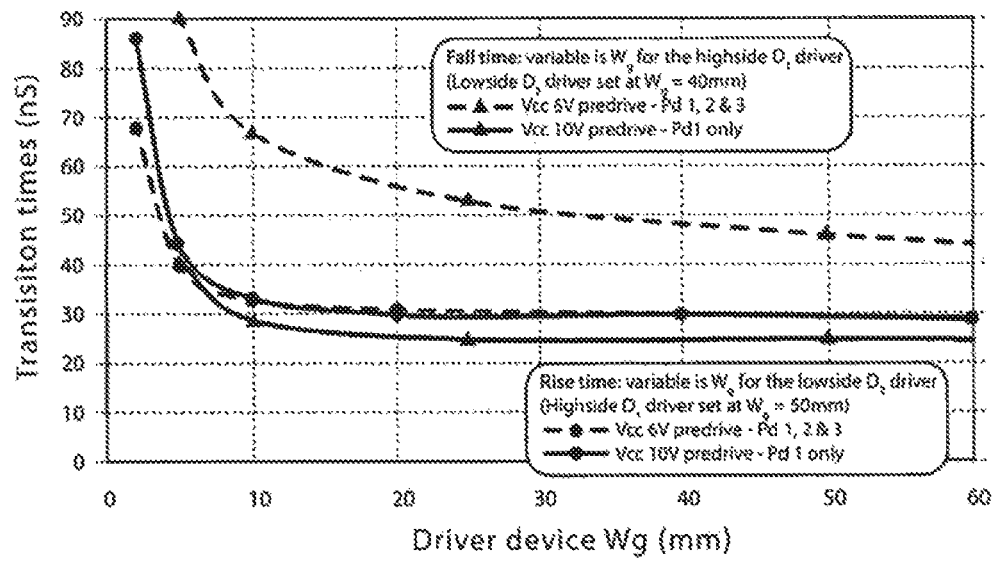
FIG. 6 shows plots of the transition times (nS) vs. the gate width Wg of the driver device D1 for driver devices D2 of a selected gate width Wg.

Referring to FIG. 6, this shows a plot of the transition times (nS) vs. the gate width (Wg) of the driver device D1 to illustrate the relationship between the sizes of the driver devices D1 and D2, the pre-driver supply voltage and the transition times. However, the quality of drive voltage to D1 is a critical factor in the design. A clean transition, as shown in FIG. 4A is obtained when the pre-driver Pd1 is provided with a 10V supply. Then the D1 driver is able to rapidly and successfully clamp the gate of D3 to the 6V supply.

In considering the Miller capacitance effect, the on-chip GaN pull down transistor D2 provides a very low impedance path for any current being injected through the Cdg, as the drain goes positive from almost zero volts to 650 V, or more, at dV/dt rates of >100V/ns.

Figure 8:
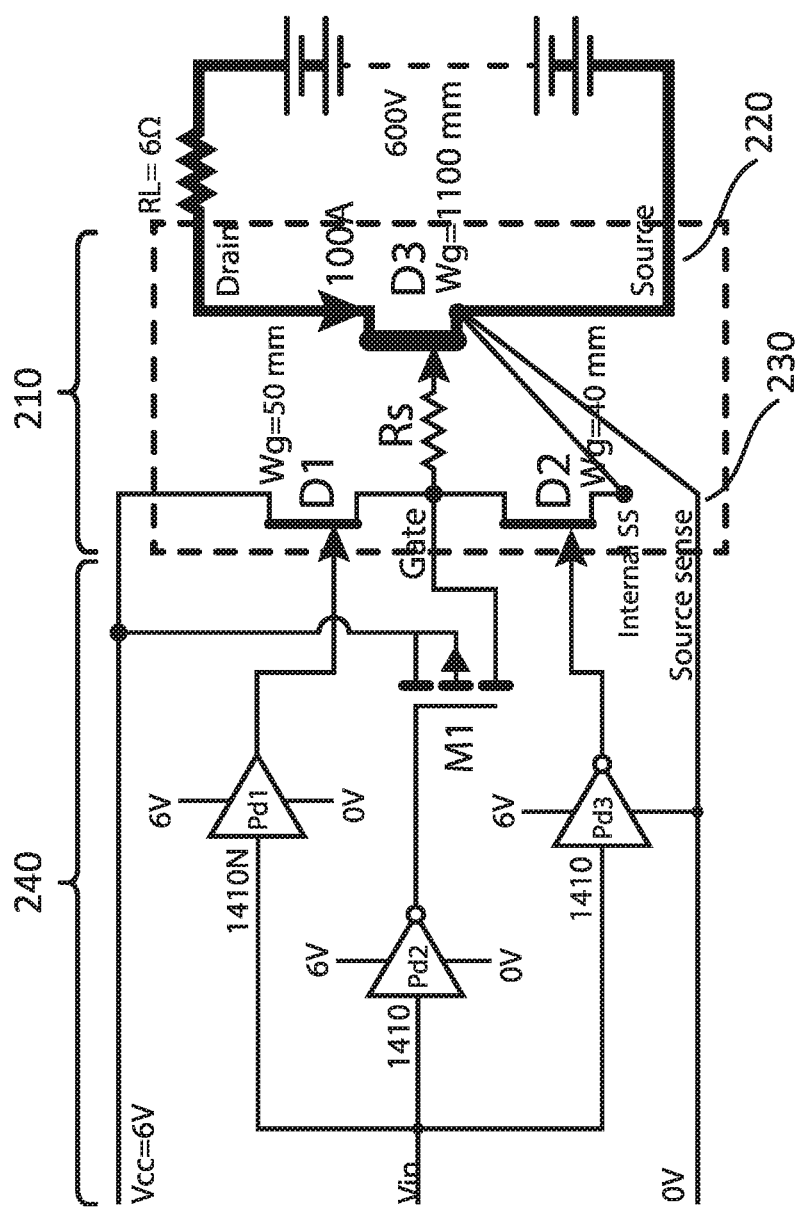
FIG. 8 shows schematically a system comprising an E-Mode GaN HEMT and driver circuitry according to a second embodiment wherein the pre-driver circuitry comprises a P channel MOSFET.

The use of a 10V power supply for one of the pre-drivers may not be acceptable for some applications. Thus, instead of using a discrete pre-driver which requires a 10V supply as illustrated in FIG. 1, in a system 200 according to a second embodiment, the pre-driver 240 comprises a large discrete P-channel MOSFET M1 that can be used to clearly pull the gate of D3 to the 6V supply, as illustrated in FIG. 8. The large P-channel MOSFET M1 is driven so that the external gate of D3 is clamped to Vcc externally. This requires that Pd2 becomes an inverting driver to drive only the P-channel MOSFET. Otherwise, the components of the system 200 are similar to those described above with reference to FIG. 1.

Figure 9:
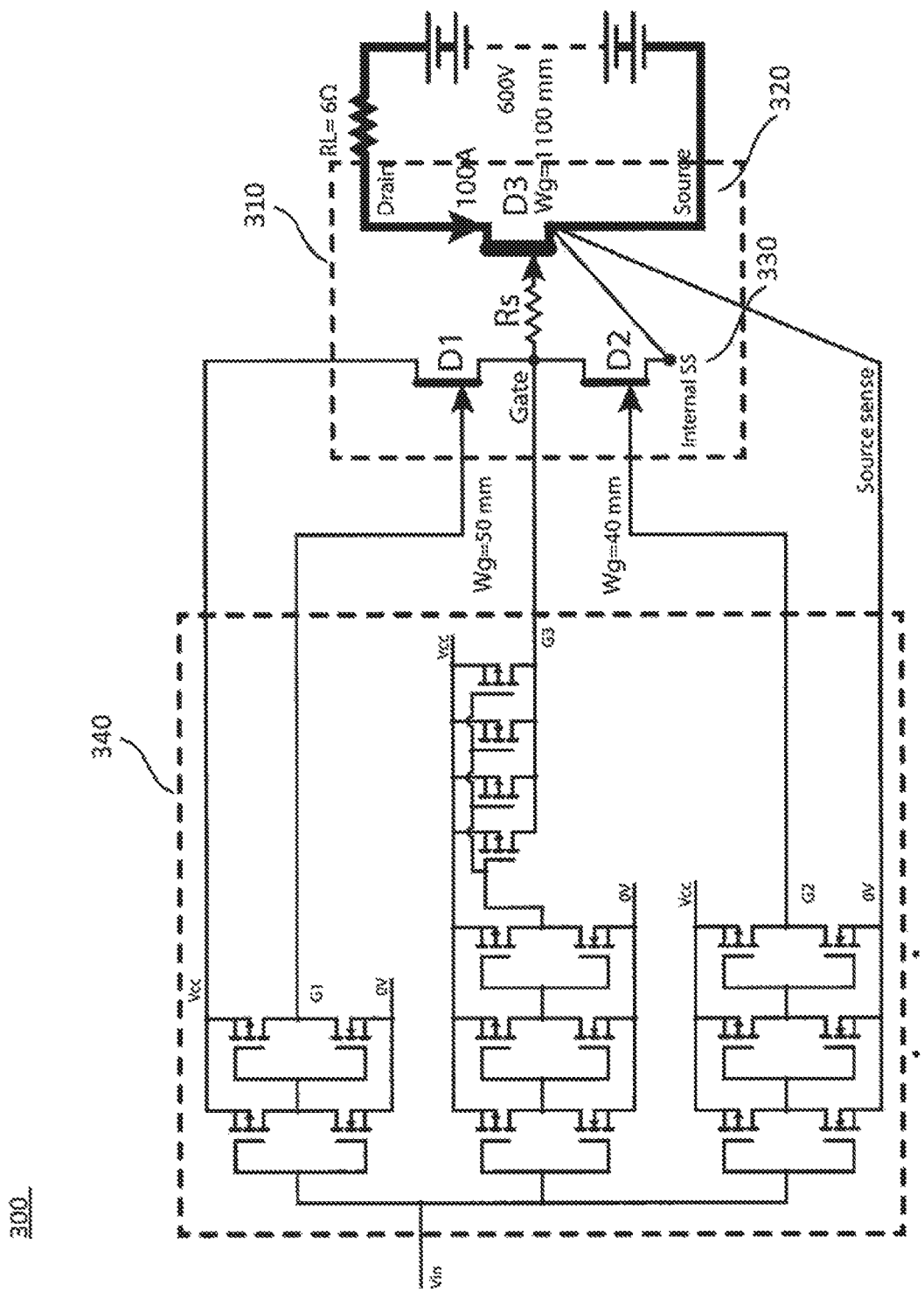
FIG. 9 shows schematically a system comprising an E-Mode GaN HEMT and driver circuitry according to a third embodiment wherein components of the pre-driver circuitry including the integrated P channel MOSFET are fully integrated.

In a system 300 according to a third embodiment, the pre-driver circuitry 340 is fully integrated to provide a single-chip driver as shown schematically in FIG. 9. The technology shown in FIG. 9 is CMOS, but other technologies can be used. The particular schematic shown is a simplification to provide clarity: it does not show Schmitt inputs and the required anti-shoot-through circuitry (i.e. to prevent current flow if D1 and D2 were to be both turned on simultaneously). The key element of the simplified design shown is the integrated large P-channel structure used to rapidly drive power switch transistors D3 fully on. The fully integrated pre-driver enables a smaller system size and higher reliability. As will be appreciated, the pre-driver circuitry shown in FIG. 9 is thus an integrated version of the discrete pre-driver circuit shown in FIG. 8.

Large area P-channel devices use considerable space on an integrated circuit and are preferably replaced with N-channel devices when possible. If an N-channel pre-driver is used, a method is required that boosts the gate voltage drive provided to driver device D1. Once a voltage boost circuit is contemplated, it is possible to consider a simplification of the pre-driver. The availability of boost circuitry is therefore highly beneficial.

Figure 10:
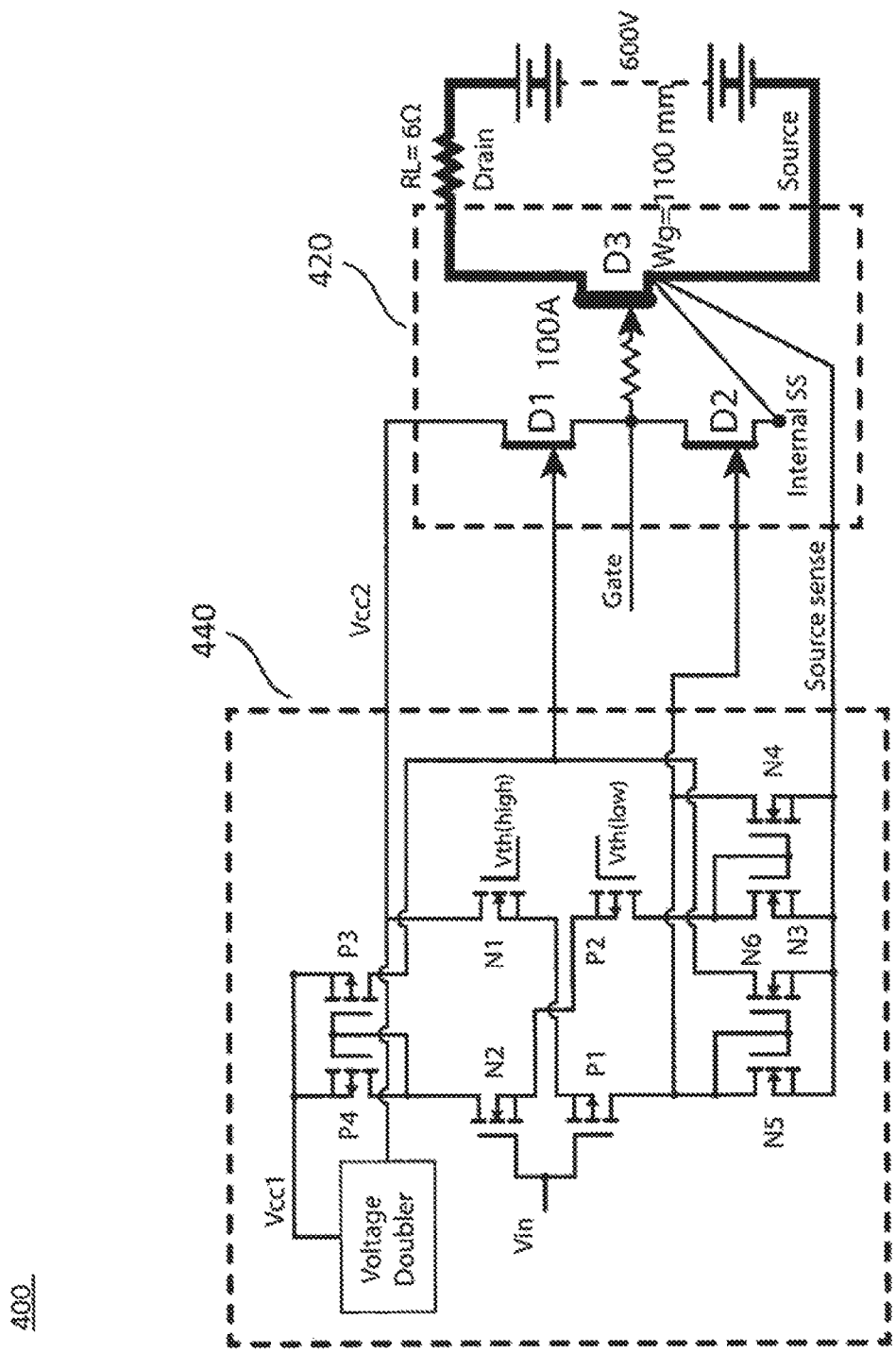
FIG. 10 shows schematically a system comprising an E-Mode GaN HEMT and driver circuitry according to fourth embodiment.

Thus, a system 400 comprising a driver according to a fourth embodiment is shown in FIG. 10. This system comprises a GaN chip 420 comprising a GaN E-Mode device D3 with integrated driver circuitry comprising GaN transistors D1 and D2. Gate connections are provided for drive voltages to the gates of D1 and D2, but unlike the embodiments described above, there is no external gate drive connection to the gate of D3. The circuit also comprises internal and external source-sense (Kelvin) connections, as described above with reference to the embodiments shown in FIGS. 1, 2, 8 and 9. The pre-driver circuitry 440 provides drive voltages $Vcc_1$ and $Vcc_2$ respectively to the gates of D1 and D2. The pre-driver comprises a voltage doubler to provide the required higher gate drive voltage $Vcc_1$ for D1. That is, the voltage doubler circuit creates a $Vcc_1$ of 12V from the $Vcc_2$ of 6V and allows the output transistor D3 to transition without shoot-through current and without the need for the additional driver to the gate of D3.

This pre-driver operates as follows. When Vin is low, i.e. less than $(Vtp+Vtn+Vth_{high})$, P1 and N1 conduct current I and D2 is on, which holds D3 off. When Vin is high, i.e. more than $(Vtp+Vtn+Vth_{low})$, N2 and P2 conduct current I and P4 and P3 are on and provide gate current to D1, which provides gate current to D3, such that D3 is on. To ensure D2 and D1 are not on at the same time, while D1 is on, D2 must be off and so the current in P2 turns on N3 and N4, holding D2 off. Similarly, to ensure D1 is off when D2 is on, the current flowing in P1 turns on N5 and N6, thus sinking any current on gate of D1, and holding D1 off. Thus, D3 is switched without an external gate connection to D3 from the pre-driver and there is no shoot through current. The use of $Vcc_2$ at 6V ensures that D3 is not overstressed, while the voltage doubler develops a suitable boost voltage $Vcc_1$ at 12V to turn on D1 fully.

Figure 11:
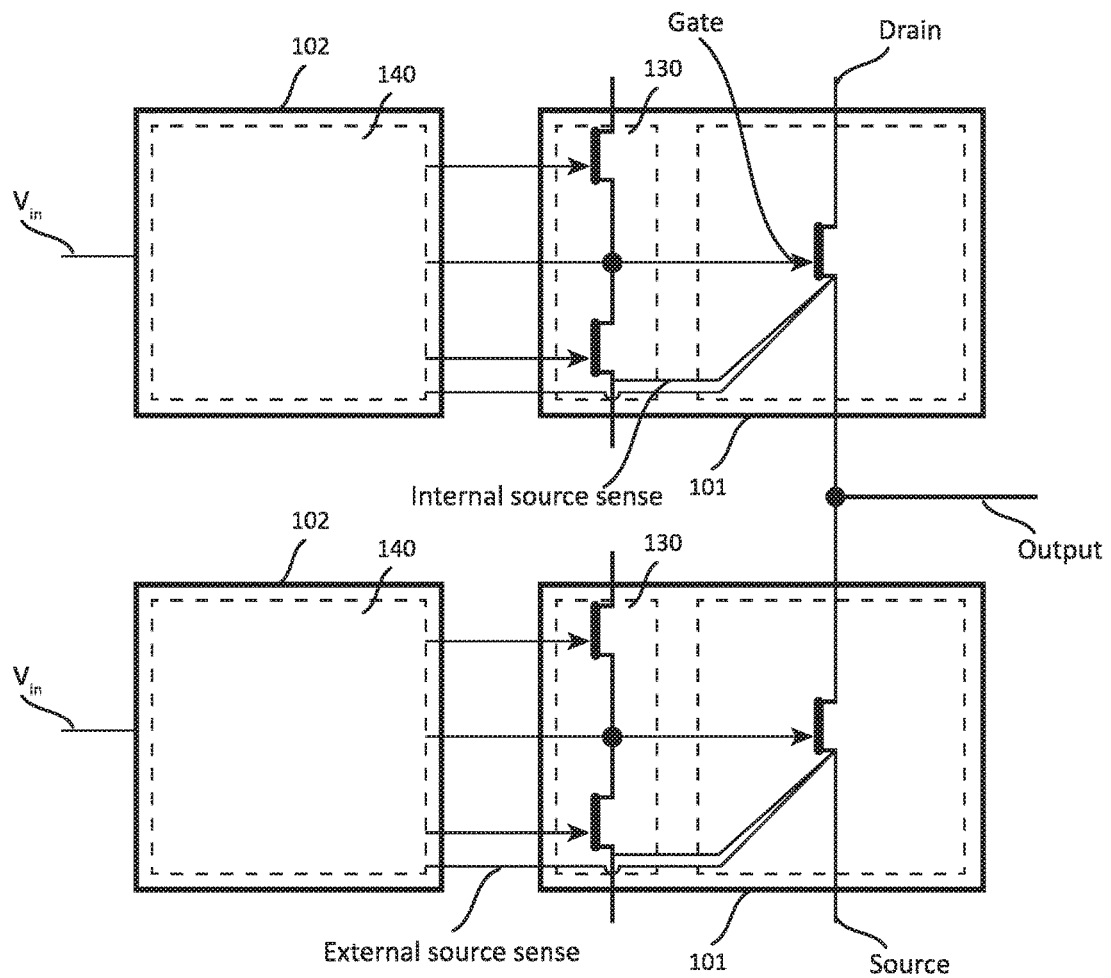
FIG. 11 shows schematically a system according to another embodiment comprising two GaN switching devices, each having its own integrated driver circuit and discrete pre-driver circuit.

The designs presented herein also offers advantages of scalability. Integrating only the GaN driver transistors D1 and D2 on the GaN chip takes up some space on the GaN chip, but takes less space, and is far simpler and less expensive to fabricate than a fully integrated GaN on-chip pre-driver/driver on-chip with the GaN switch D3. As mentioned above, the discrete pre-driver may comprise lower cost components. In the embodiments described above, each GaN chip or device 110, 210, 310, 420, i.e. comprising a GaN E-mode switch D3 and integrated smaller GaN E-mode driver transistors D1 and D2, may be referred to as a "Drive Assist™" E-mode GaN transistor. Each Drive Assist E-mode GaN transistor switch may be coupled with its own pre-driver circuit. For example, as illustrated schematically in FIG. 11, a system may be provided comprising two GaN switch devices 110, e.g. High Side Switch (HSS) and Low Side Switch (LSS), on respective GaN substrates 101, each GaN device 110 being a Drive Assist™ GaN E-mode transistor comprising GaN switches 120, i.e. GaN E-mode transistor D3 with integrated GaN drivers 130 comprising GaN E-mode transistors D1 and D2, and respective pre-driver circuitry 140 on a separate substrate (chip) 102.

Design guidelines and circuit layout considerations for exemplary embodiments of E-mode drivers are also discussed in more detail, with an example of a reference design, in a recent Application note issued by GaN Power Systems Inc. (GN001 Rev.2014-10-21) entitled "How to Drive GaN Enhancement Mode Power Switching Transistors", which is incorporated by reference in its entirety.

While specific embodiments have been described in detail above with reference to the figures, by way of example, it will be appreciated that modifications and variations of the embodiments may be made.

INDUSTRIAL APPLICABILITY

In summary, the design issues related to driving E-Mode GaN power devices centre around the low threshold voltage. An integrated driver or driver mounted within the same package is able to provide the required noise immune drive to the power switch.

Power switching systems are disclosed with improved driver circuitry for normally-off or enhancement mode (E-Mode) GaN power transistors with low threshold voltage. Preferably, the GaN switch D3 comprises an E-Mode HEMT with a monolithically integrated GaN driver circuit and a discrete dual-voltage pre-driver circuit 140. The integrated driver comprises relatively small E-Mode GaN HEMTs D1 and D2. D1 operates to provide the gate drive voltage to the gate of the GaN switch and D2 operates to clamp the gate of the GaN switch D3, by means of an internal source-sense connection between the source of D3 and the source of D2. Moreover, the integrated driver transistor D1 assists in providing noise immunity to the gate of D3, e.g. voltage spikes coming in on the gate of D3; and the integrated lower driver transistor D2, assists in preventing false turn-on due to the Miller effect during a switching transition of D3. Unexpectedly, it has been observed that the integrated lower driver transistor D2 also helps significantly to provide noise immunity to the gate of D3, i.e. by clamping the gate of D3 to the source to hold D3 off in the presence of noise voltage spikes coming in externally on the gate or source sense lines.

Also provided is an external source-sense connection for connection to the pre-driver. The pre-driver provides a drive voltage to the gates of each of D1 and D2, and optionally to D3. Preferably, boost circuitry provides for a higher drive voltage, e.g. 10V, to be supplied to the gate of D1 to produce firm and rapid pull up of D1 for improved switching performance at higher switching speeds.

Partitioning the driver circuitry enables high current handling components to be integrated with the GaN switch and directly coupled, to reduce inductance. Use of a separate pre-driver module or chip, with either discrete or integrated components, also allows for the pre-driver to be thermally separated from the GaN chip, e.g. to enable use of lower cost MOSFET drivers.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A GaN transistor switching device comprising:
an enhancement mode (E-Mode) GaN switch having an integrated GaN driver;
the E-Mode GaN switch comprising a GaN transistor switch D3 fabricated on a substrate and the integrated GaN driver being integrated monolithically with the GaN transistor switch D3 on the substrate, wherein:
the integrated GaN driver comprises a first, pull-up, E-Mode GaN driver transistor D1 and a second, pull-down, E-Mode GaN driver transistor D2, the drain of the D1 being coupled to Vcc, and the source of D1 being coupled to the drain of D2 at a node N, and node N being coupled to the gate of D3, and an internal source-sense connection closely coupling the source of D3 and the source of D2, such that the first transistor D1 operates to deliver a drive voltage to the gate of the GaN transistor switch D3, and the second transistor D2 operates to clamp the gate of the GaN transistor switch D3 to Vss by means of the internal source-sense connection $SS_{internal}$;
inputs for coupling to a pre-driver supplying gate drive voltages to the gates of D1 and D2 and, optionally, to the gate of D3, and
an external source-sense connection $SS_{external}$ for coupling to the pre-driver.

2. The device of claim 1 wherein D3 is a large gate width E-Mode GaN HEMT having a threshold voltage of ~1.5V and D1 and D2 are smaller gate width E-Mode GaN HEMTs.

3. A method of operating the GaN switching device D3 having integrated GaN driver circuitry comprising D1 and D2, as defined in claim 1, comprising:
providing, from a pre-driver, dual voltage drive outputs comprising a first drive voltage 0-$Vcc_1$ for driving the gate of D1 and a second drive voltage 0-$Vcc_2$ for driving the gate of D2, wherein $Vcc_1$ is greater than $Vcc_2$.

4. A GaN power switching system comprising:
an enhancement mode (E-Mode) GaN switch and driver circuitry comprising an integrated GaN driver and a discrete pre-driver;
the E-Mode GaN switch comprising a GaN transistor switch (D3) fabricated on a first substrate and the integrated GaN driver being integrated monolithically with the GaN transistor D3 on the GaN chip, wherein:
the integrated GaN driver comprises a first, pull-up, E-mode GaN driver transistor D1 and a second, pull-down, E-mode GaN driver transistor D2, the drain of D1 being coupled to the supply voltage Vcc, and the source of D1 being coupled to the drain of D2 at node N, which is coupled to the gate of D3, such that the first transistor D1 operates to deliver a drive voltage to the gate of the GaN transistor switch D3, and an internal source-sense connection closely coupling the source of D3 and the source of D2, such that the second transistor D2 operates to clamp the gate of the GaN transistor switch D3 to source by means of the internal source-sense connection $SS_{internal}$;
external gate inputs for supplying gate drive voltages from the pre-driver to each of the gates of D1 and D2, and optionally to the gate of D3; and an external source-sense connection $SS_{external}$ for coupling to the pre-driver circuit; and
the pre-driver is fabricated on a second, pre-driver, substrate 102, the pre-driver having an input for receiving an input voltage Vin and outputs for delivering gate drive voltages to the gate connections of each of GaN driver transistors D1 and D2 of the integrated GaN driver.

5. The system of claim 4, wherein the pre-driver further comprises an output for delivering a gate drive voltage to the gate of D3.

6. The system of claim 4, wherein D3 is a large gate width E-Mode GaN HEMT having a threshold voltage of ~1.5V and D1 and D2 are smaller gate width E-Mode GaN HEMTs.

7. The system of claim 6, wherein the pre-driver is a dual voltage pre-driver configured with non-inverting pre-driver circuitry to supply a first drive voltage 0-$Vcc_1$ to the gate of D1, inverting pre-driver circuitry to supply a second drive voltage 0-$Vcc_2$ to the gate of D2, and when there is a gate connection to the gate of D3, non-inverting pre-driver circuitry to supply the second drive voltage 0-$Vcc_2$ to the gate of D3, and wherein the first supply voltage $Vcc_1$ is higher than the second supply voltage $Vcc_2$.

8. The system of claim 7 wherein the pre-driver supplies a gate drive voltage $Vcc_2$ of 0-6V and a gate drive voltage $Vcc_1$ of 0-10V.

9. The system of claim 7 wherein the pre-driver comprises a voltage doubler that develops a voltage supply $Vcc_1$ of 12V from a voltage supply $Vcc_2$ of 6V.

10. The system of claim 4 wherein the pre-driver comprises first, second and third discrete pre-driver components Pd1, Pd2 and Pd3 coupled in parallel paths between the input for Vin and respective outputs for gate voltages to D1, D2 and D3; Pd1 and Pd2 being non-inverting and configured so that when Vin is high a gate drive voltage is supplied to turn on the driver transistor D1 which provides a gate voltage to the gate of D3 to turn on the power switch D3, and Pd3 being an inverting element configured so that when Vin is low a gate drive voltage is supplied to D2 to turn on D2 to clamp the power switch D3 off.

11. The system of claim 10 wherein the Pd1 pre-driver is a 10V non-inverting driver and Pd2 is a 6V non-inverting driver and Pd3 is a 6V inverting driver.

12. The system of claim 10 wherein the discrete pre-driver components comprise CMOS pre-drivers.

13. The system of claim 4 wherein the pre-driver provides a single supply voltage Vcc, first, second and third pre-driver circuit components Pd1, Pd2 and Pd3, and a large p-channel MOSFET M1, wherein the source of the M1 is coupled to Vcc, the drain of the MOSFET M1 coupled to the gate of D3 for pulling the gate to the power supply voltage Vcc; Pd1 being a non-inverting driver being coupled between the input for Vin and output to the gate of D1 for driving the gate of D1; Pd3 being an inverting driver being coupled between the input for Vin and output to the gate of D2 for driving the gate of D2; and Pd2 being an inverting driver coupled between the input for Vin and the gate of the p-channel MOSFET M1 for driving the gate of M1, such that M1 drives the gate of D3.

14. The system of any claim 4 wherein the pre-driver comprises an integrated circuit using a single supply voltage Vcc; first, second and third integrated pre-driver circuit elements Pd1, Pd2 and Pd3, and a large p-channel MOSFET structure M1, wherein the source of the M1 is coupled to Vcc, the drain of the MOSFET is coupled to the gate of D3 for pulling the gate to the power supply voltage Vcc; Pd1 being a non-inverting driver being coupled between the input for Vin and output to the gate of D1 for driving the gate of D1; Pd3 being an inverting driver being coupled between the input for Vin and output to the gate of D2 for driving the gate of D2; and Pd2 being an inverting driver coupled between the input for Vin and the gate of the p-channel MOSFET M1, such that M1 drives the gate of M1.

15. The system of claim 4 wherein the pre-driver comprises voltage boost circuitry for developing a supply voltage $Vcc_1$ from a supply voltage Vcc, wherein $Vcc_1$>Vcc; and wherein the pre-driver is configured to provide a first output drive voltage of 0-$Vcc_1$ to the gate of D1 and a second output voltage 0-Vcc to the gate of D2.

16. The system of claim 15 wherein the pre-driver provides outputs to the gates of D1 and D3, and wherein the pre-driver further comprises circuit elements P1, N1 and N2, P2, P3 and P4; N3 and N4, N5 and N6; said elements being coupled as illustrated in FIG. 10, such that:

when Vin is low and less than Vtp+Vtn+$Vth_{high}$, P1 and N1 conduct current I and D2 is on, which holds D3 off; and when Vin is high and more than Vtp+Vtn+$Vth_{low}$, N2 and P2 conduct current I and P4 and P3 are on and provide gate current to D1, which provides gate current to D3, such that D3 is on; and N3, N4, and N5, N6 being coupled to ensure D2 and D1 are not on at the same time, such that while D1 is on, D2 must be off and so the current in P2 turns on N3 and N4, holding D2 off; similarly, to ensure D1 is off when D2 is on, current flowing in P1 turns on N5 and N6, thus sinking any current on gate of D1, and holding D1 off.

* * * * *